US 6,746,252 B1

(12) United States Patent
Scott

(10) Patent No.: US 6,746,252 B1
(45) Date of Patent: Jun. 8, 2004

(54) HIGH FREQUENCY COMPRESSION MOUNT RECEPTACLE WITH LINEAL CONTACT MEMBERS

(75) Inventor: Larry S. Scott, Carrollton, TX (US)

(73) Assignee: Plastronics Socket Partners, L.P., Irving, TX (US)

(*) Notice: Subject to any disclaimer, the term of this patent is extended or adjusted under 35 U.S.C. 154(b) by 0 days.

(21) Appl. No.: 10/210,330

(22) Filed: Aug. 1, 2002

(51) Int. Cl.[7] .................................................. H01R 12/00
(52) U.S. Cl. ....................................................... 439/70
(58) Field of Search ............................. 439/70, 71, 66, 439/514, 515

(56) References Cited

U.S. PATENT DOCUMENTS

| | | | |
|---|---|---|---|
| 4,473,266 A | | 9/1984 | Soltysik et al. ............. 439/296 |
| 4,508,405 A | * | 4/1985 | Damon et al. ............... 439/260 |
| 5,174,763 A | * | 12/1992 | Wilson ......................... 439/66 |
| 5,388,997 A | * | 2/1995 | Grange et al. ................. 439/66 |
| 6,033,233 A | * | 3/2000 | Haseyama et al. ............. 439/66 |
| 6,174,172 B1 | | 1/2001 | Kazama ......................... 439/66 |
| 6,174,174 B1 | | 1/2001 | Suzuki et al. .................. 439/71 |
| 6,190,181 B1 | * | 2/2001 | Affolter et al. ............... 439/70 |
| 6,220,870 B1 | | 4/2001 | Barabi et al. .................. 439/71 |
| 6,229,320 B1 | | 5/2001 | Haseyama et al. .......... 324/754 |
| 6,264,476 B1 | | 7/2001 | Li et al. ......................... 439/66 |
| 6,341,962 B1 | | 1/2002 | Sinclair ......................... 439/66 |
| 6,354,844 B1 | | 3/2002 | Coico et al. ................... 439/66 |
| 6,369,595 B1 | | 4/2002 | Farnworth et al. .......... 324/755 |
| 2002/0093803 A1 | | 7/2002 | Olzak et al. ................. 361/767 |
| 2002/0102869 A1 | | 8/2002 | Ali et al. ....................... 439/66 |

OTHER PUBLICATIONS

Alfred Sugarman, Effects of Gold–Plated Contacts in BGA Burn–In Sockets, presented at the BiTS, Feb. 27–29,2000 ,Mesa, Az.

* cited by examiner

*Primary Examiner*—Tulsidas C. Patel
(74) *Attorney, Agent, or Firm*—Mark W. Handley; Chauza & Handley, LLP

(57) ABSTRACT

A compression mount receptacles (16) is provided for mounting test and burn-in sockets (14) to surface mount pads of circuit boards (18). The receptacle (16) includes coil spring contacts (52) having active portions provided by loosely wound coils (54) which provide compliance for accommodating tolerances and changes in distances between the test and burn-in sockets (14) and the circuit boards (18). The coil spring contacts (52) further include first and second end portions (56, 58), with some of the end portions (56) being formed of close wound coils in which adjacent coils are in contact to provide lineal circuit paths. Conductive contact tangs (60) extend within respective ones of the coil spring contacts (52) and provide substantially lineal circuit paths which electrically connect between respective ones of first and second electrical contacts (22, 20), providing a shortened contact circuit across the loosely wound coils (54) of the coil spring contacts (52).

31 Claims, 10 Drawing Sheets

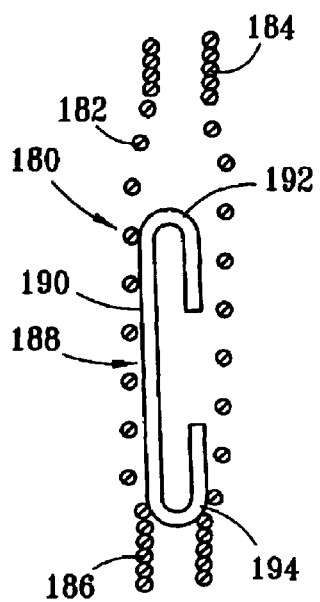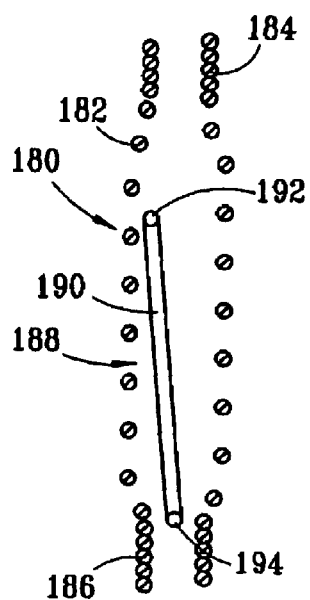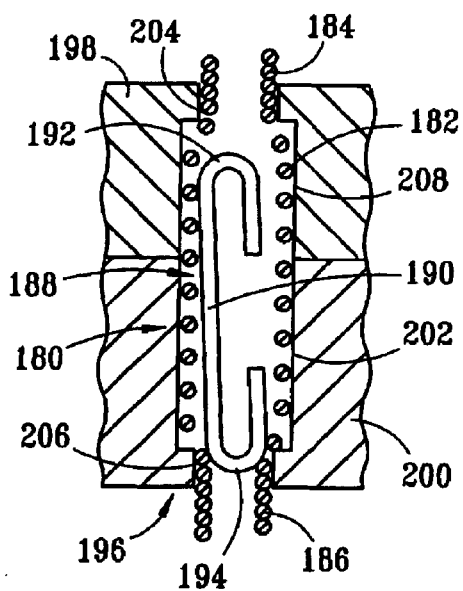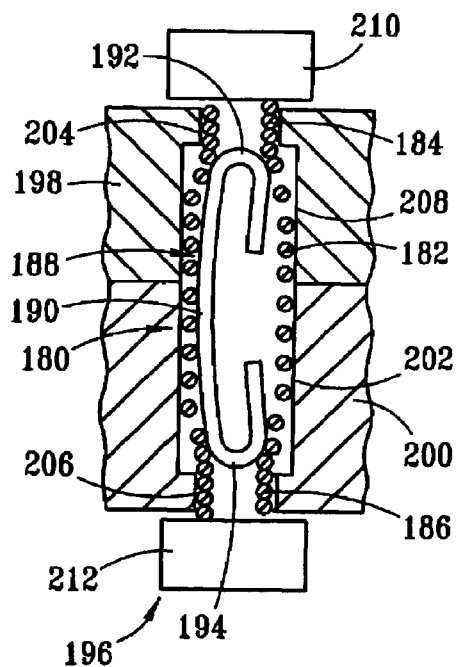

HIGH FREQUENCY COMPRESSION MOUNT RECEPTACLE WITH LINEAL CONTACT MEMBERS

INVENTORS

Larry S. Scott, a resident of Carrollton, Dallas County, Tex., United States of America, and a citizen of the United States of America.

TECHNICAL FIELD OF THE INVENTION

The present invention relates in general to compression mount receptacles for mounting components to circuit boards, and in particular to a high frequency compression mount receptacle for mounting test and burn-in sockets to circuit boards.

BACKGROUND OF THE INVENTION

Connectors, receptacles and interposers have been provided for mounting various components to printed circuit boards. Component manufacturers typically perform burn-in testing of electronic components using test and burn-in sockets to mount components to circuit boards which connect the components under test to circuitry. The test and burn-in sockets are subjected to repeated use for testing different components, and test pins for the test and burn-in sockets are subject to breakage and bending as components are loaded and removed from the test sockets. When test pins for the sockets are damaged, an entire socket often has to be removed to replace the damaged test pins. Replacement of a single test pin can thus require that a large number of solder connections be re-flowed to remove the test socket, which can result in damage to the circuit board to which the test socket is mounted. In order to accommodate various size and alignment tolerances, test pins for test and burn-in sockets have been provided with tails which extend downward for mounting in through-holes of a through-hole style circuit boards. Due to the small contact lead or land spacings of current electronic components, through-hole style circuit boards are used for mounting test sockets to circuit boards. Although surface mount technology may also be used, size and cost limitations also require that the test and burn-in sockets be soldered to the circuit boards.

Helical coil compression springs have been used to provide compliant connections in electric circuits. However, helical coil compression springs are not suitable for use as electrical contacts in high frequency circuits, since the coils of the springs are electrical inductors which have the undesirable effect of smoothing out high frequency signals. In the past, when component contact spacings were larger, metallic tubular electrical contacts, commonly referred to as pogo pins, were used to provide compliant connections between test circuits and components under test. Typically, the tubular contacts included a pair of metallic sleeves which were telescopically joined to provide compliant electrical connections which could accommodate different distances between mating contact lands. Helically coiled compression springs were mounted inside of the pairs of telescoping tubular members. The metallic, telescoping tubes provided an electrical path around the interiorly disposed coil springs, and the interiorly disposed coil springs provided compliance, pushing the respective pairs of metallic tubes apart under compressive loads.

SUMMARY OF THE INVENTION

A compression mount receptacle is provided for mounting test and burn-in sockets for connecting components under test to test circuitry. The receptacles include a plurality of helical coil spring contacts which have active portions defined by of loosely wound coils which provide compliance for accommodating tolerances and changes in distances between the test and burn-in sockets and the circuit boards. The coil spring contacts further include first and second contact end portions, with some of the contact end portions being formed of close wound coils in which edges of adjacent coils are in contact to provide lineal circuit paths. Conductive contact tangs extend within respective ones of the coil spring contacts and provide a substantially lineal circuit paths which electrically connect between respective ones of first and second electrical contacts, providing a shortened contact circuit across the loosely wound helical coils of the coil spring contacts. In one embodiment, the coil spring contacts are defined by helically wound, conductive wires having first end portions formed to extend within the loosely wound coils and contact the close wound coils to provide the contact tangs. The test and burn-in sockets include contact lead tails which extend from beneath the sockets for insertion into the coil spring contacts, to press against the contact tangs located inside of the contact springs.

In alternative embodiments, the contact tangs may be provided as separate members from the helical coil compression springs, with the contact tangs extending interiorly within respective ones of the coil spring contacts. In one embodiment, the contact tangs each have a head and a shank. The head contacts a contact of a test socket or of a component under test, and the shank extends to contact a close wound end portion of the coil spring contact. In another embodiment, a contact button is disposed within a housing of the receptacle and engages between an end of the active portion of the springs and the contact of the test socket or a component under test. A contact tang extends from the contact button to the opposite end of the coil spring, preferably directly engaging close wound coils.

BRIEF DESCRIPTION OF THE DRAWINGS

For a more complete understanding of the present invention and the advantage thereof, reference is now made to the following description taken in conjunction with the accompanying Drawings in which:

FIG. 20 is a longitudinal section view of a fifth embodiment of a coil spring contact having an interiorly extending contact tang;

FIG. 21 is a longitudinal section view of the fifth coil spring contact, taken along a sectioning plane which is at a right angle to the sectioning plane of FIG. 20;

FIG. 22 is a partial section view of an alternative receptacle which includes the fifth coil spring contact;

FIG. 23 is a partial section view of the alternative receptacle of FIG. 22 electrically connecting between two surface mount contacts;

DETAILED DESCRIPTION OF THE INVENTION

Figure 1:
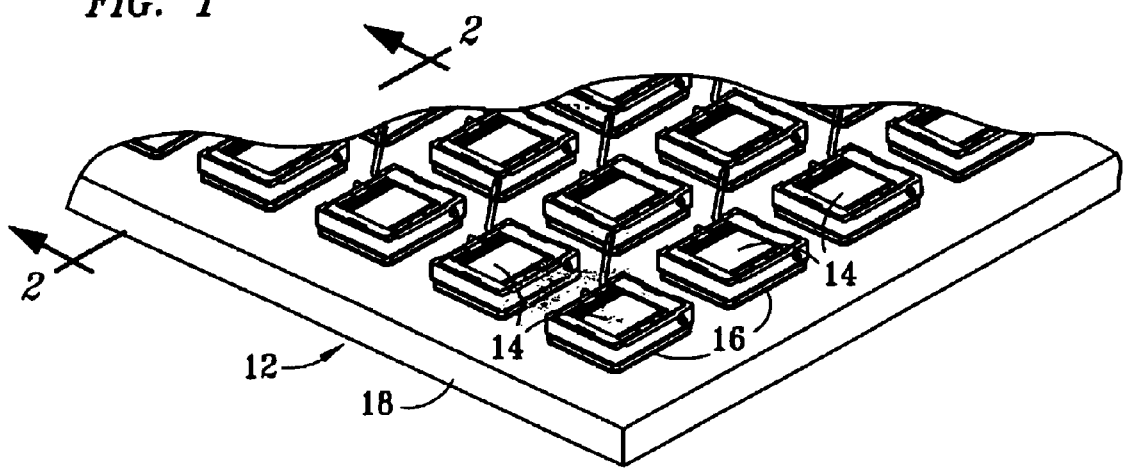
FIG. 1 is a partial perspective view of a test and burn-in fixture having a plurality of test sockets mounted to a surface mount board.

FIG. 1 is a partial perspective view of a test fixture 12 used for test and burn-in of electrical semiconductor components. The test fixture 12 includes a plurality of test and burn-in sockets 14, a plurality of surface mount receptacles 16, and a surface mount board 18. The test and burn-in sockets 14 preferably have through-hole type contact leads which are received within the surface mount receptacles 16. The surface mount receptacles 16 have contacts which directly connect to surface lands of the surface mount board 18.

Figure 2:
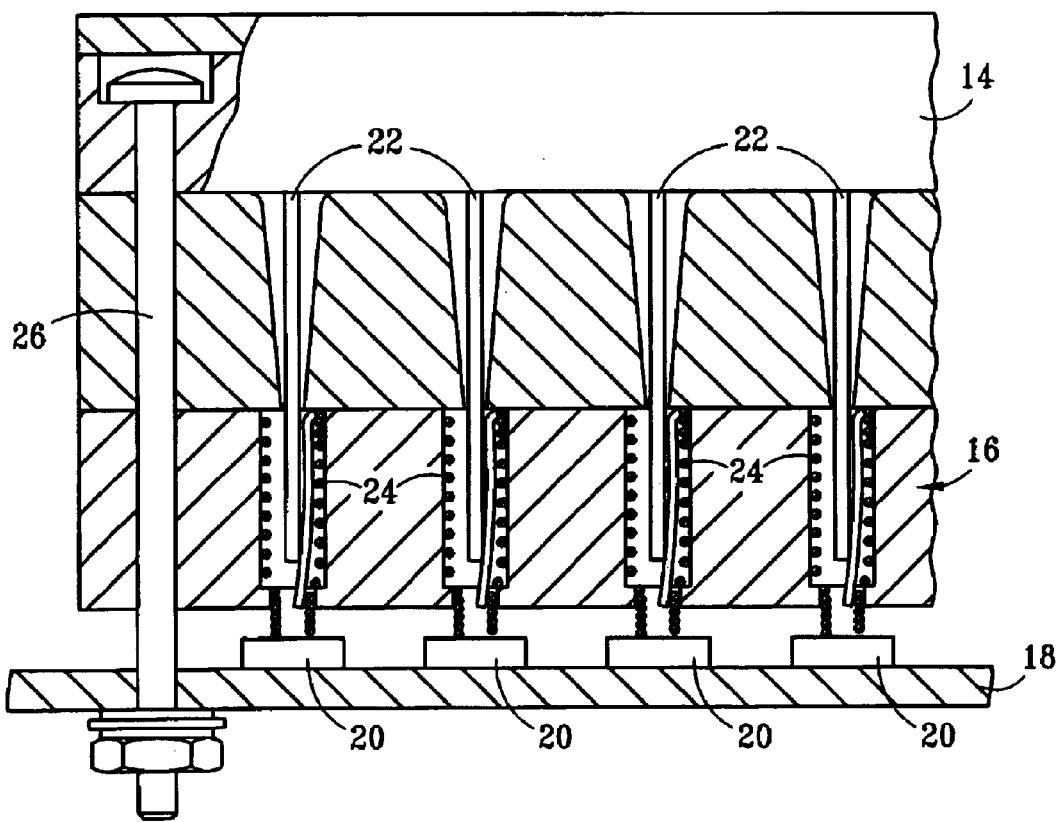
FIG. 2 is a partial section view of a test socket and receptacle of the test and burn-in fixture, taken along section line 2—2 of FIG. 1.

FIG. 2 is a partial section view of one of the test and burn-in sockets 14 and one of the surface mount receptacles 16 of the test fixture 12, taken along section line 2—2 of FIG. 1. The test and burn-in socket 14 has test contacts 22 which extend from beneath the socket 14 with tails that provide through-hole type leads. The test socket 14 and test contacts 22 may be of any suitable type, in some embodiments the test contacts may be that of any type of contact for a component package, including the surface contacts of leadless chip carriers, quadpacks, and any of the various other component packages. The ends of the test contacts 22 extend into the receptacle 16 and engage compliant test contacts 24 of the receptacle 16. Preferably, the compliant test contacts 24 are provided by helical coil compression springs having a nominal diameter of twenty-one thousandths of an inch, and extend from within the receptacle 16 and contact the surface pads 20 of the circuit board 18. The socket 14 and the receptacle 16 and mounted to the board by fasteners 26, which are preferably bolts which extend downward from the receptacle 16 and through the circuit board 18.

Figure 3:
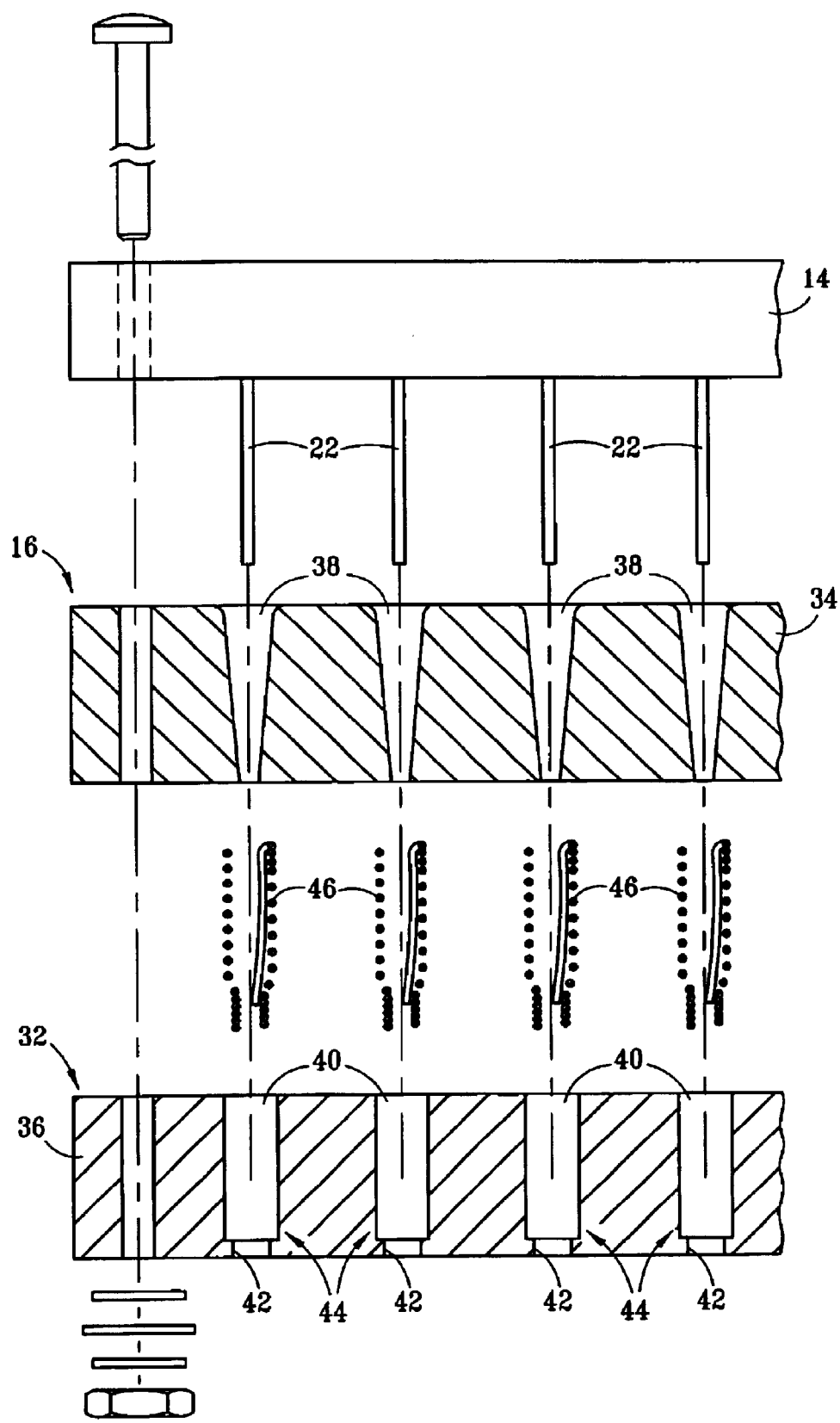
FIG. 3 is an exploded, partial section view of the test socket and the receptacle of FIG. 2.

FIG. 3 is an exploded, partial section view of the test and burn-in socket 14 and the receptacle 16 of FIG. 2. The receptacle 16 has a housing 32, which is formed of an insulating material. The housing 32 includes a guid housing 34 and a contact housing 36 which are secured together, preferably with the fasteners 26, but in other embodiments the housings 34 and 36 may be secured together with other types of fasteners, adhesives, or by sonic welding with a fastener. The guide housing has apertures 38 which are aligned in registration with respective ones of the contacts 22 of the socket 14. The apertures 38 taper inward toward an end of the guide housing 34 which is closest to the contact housing 36, such that the tapered apertures 38 guide the through-hole type ends of the contacts 22 of the socket 14 into the contact housing 36. The contact housing 36 as a plurality of chambers 40 and ports 42, which are aligned in registration with respective one of the apertures 38 of the receptacle 16. The chambers 40 and ports 42 together define apertures 44 in the receptacle housing 32 for receiving the compliant contacts 46. Preferably, the compliant contacts 46 are helical coil compression springs having substantially lineally extending, interiorly disposed conductors, as described below.

Figure 4:
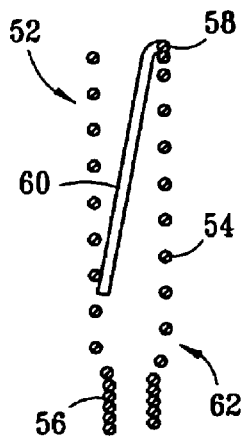
FIG. 4 is a longitudinal section view of a coil spring contact having a contact tang which extends interiorly within coil windings of the coil spring contact.

FIG. 4 is a longitudinal section view of a coil spring contact 52 which may be used to provide one of the compliant contacts 46 of FIG. 3. The coil spring contact 52 preferably has loosely wound coils 54 on a first end, and close wound coils 56 on a second end. The loosely wound coils 54 are active coils in providing compliance with various lengths and alignment between the contacts 22 of the test and burn in socket 14 and the pads 20 of the circuit board 18, the loosely wound coils 54 being free to deflect along a longitudinal axis of the coil spring contacts 52 when placed under axial loads. The close wound coils 56 are wound to a reduced diameter at one end of loosely wound, active coils 54, and define contact ends for the coil contacts 52. The close wound coils 56 are close wound, such that edges of adjacent ones of the coils 56 are touching, making electrical contact there-between to define circuit paths which extend through the adjacent ones of the coils in a substantially straight line. The coil spring contact 52 further includes a contact tang 60 which extends from a first end 58 of the contact 52. The contact tang 60 extends interiorly within the loosely wound, or active, coils 54. The coil spring contact 52 is preferably formed by a singular piece of conductive spring wire 62 to define a helical coil compression spring. The coil spring contact 54 is formed of a single length of conductive spring wire 62. The contact tang 60 is formed by a straight end portion of the length of wire 62, an intermediate portion of the length of wire 62 is formed to provide the loosely wound coils 54, and an end portion of the length of wire 62, which is opposite from the portion of the wire 62 providing the contact tang 60, is formed to provide the close wound coils 56.

Figure 5:
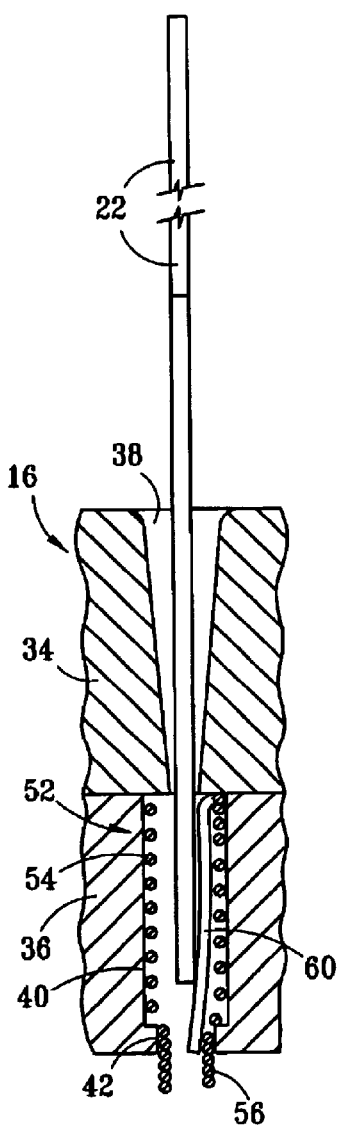
FIG. 5 is a partial section view of a receptacle for mounting a test socket to a circuit board, taken along section line 2—2 of FIG. 1.
Figure 6:
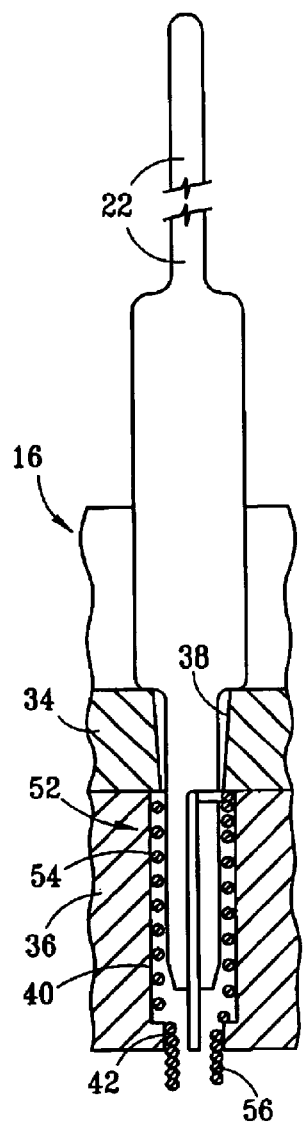
FIG. 6 is a partial section view of a receptacle for mounting the test socket to the circuit board, taken along sectioning plane which is at a right angle to the sectioning plane of FIG. 5.

FIG. 5 is a partial section view showing one of the contacts 22 of the test sockets 14 mounted in one of the receptacles 16, and FIG. 6 is a partial section view of the receptacle 16, taken along a sectioning plane which is at a right angle to the sectioning plane of FIG. 5. The coil spring contact 52 is disposed within the chamber 40 of the contact housing 36, with the loosely wound, active coils 54 being compressed between a shoulder adjacent to the port 42 and the end of the guide housing 34 which is adjacent to the guide housing 34, to preload the spring contact 52 near its desired operating force, such that the contact tang 60 extends within the close wound coils 56. An end of one of the test contacts 22 extends through the tapered aperture 38 and into the chamber 40 of the contact housing 36. The test contact 22 is pressing against the contact tang 60, pushing a terminal end portion of the contact tang 60 into contact with the close wound coils 56. The end of the close wound coils 56 which protrudes outward of the coil housing 36 is preferably soldered to a through-hole pad, or a surface mount contact land. In other embodiments, the receptacle 16 may be mounted to a surface mount circuit board such that the end of the close wound coils 56 presses against a contact land, with the loosely wound coils 54 providing compliance to create a surface pressure electrical connection. The receptacle 16 may thus be utilized to provide a compression mount electrical connection between a non-compliant socket or connector contact, and a surface where an electrical connection is desired.

Figure 7:
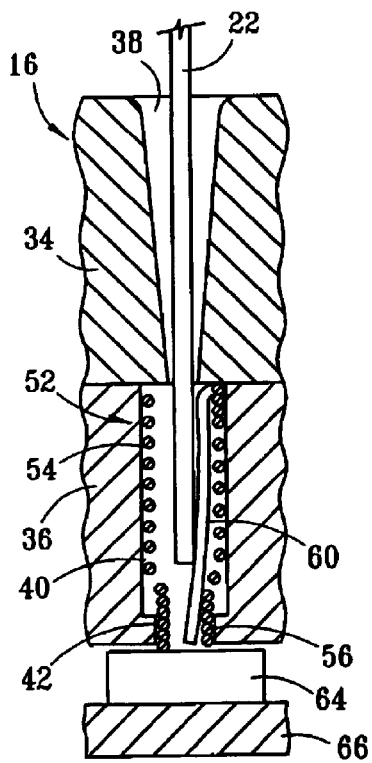
FIG. 7 is a partial section view of a receptacle electrically connected between two contacts.
Figure 8:
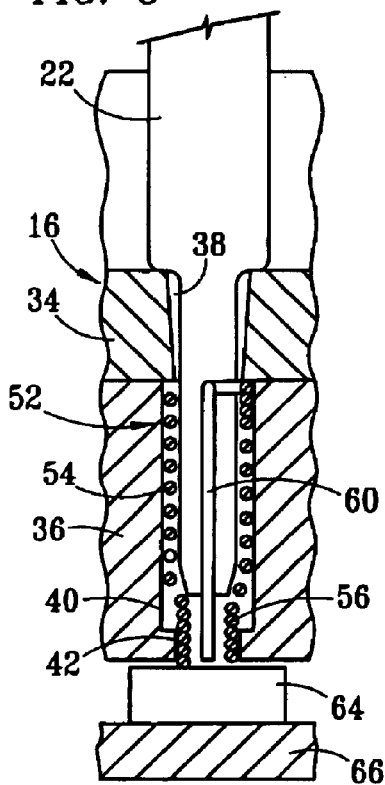
FIG. 8 is a partial section view of a receptacle electrically connected between two contacts; taken along a sectioning plane which is at a right angle to the sectioning plane of FIG. 7.

FIG. 7 is a partial section view of the receptacle 16 engaging a contact land 64 of a surface mount board 66, and FIG. 8 is a partial section view of the receptacle 16 taken along a sectioning plane which is at a right angle to the sectioning plane of FIG. 7. With the receptacle 16 mounted to the circuit board 66, the end of the close wound coils 56 contacts the land 64. The terminal end of the close wound coils 56 presses against the land 64 in a pressure electrical connection. The terminal end of the close wound coils 56 may also be soldered to the land 64 by solder re-flow techniques. It should be noted, that as in each of the above-noted embodiments, the electrical circuit path from the contact 22 of the socket 14 to the contact land 64 of the circuit board 66 does not pass through the loosely wound coils 54, but rather it passes directly from the contact 22, through the contact tang 60, to the close wound coils 56 and to the land 64, providing a shortened circuit path than if the circuit path were through the loosely wound, active coils 54. The circuit path through the contact tang 60, as opposed to passing through the loosely wound, active coils 54, provides a circuit path which is substantially geometrically lineal, or substantially in a straight line, providing a more reliable high frequency test circuit than if the active, loosely wound coils 54 were included in the circuit path.

Figure 9:
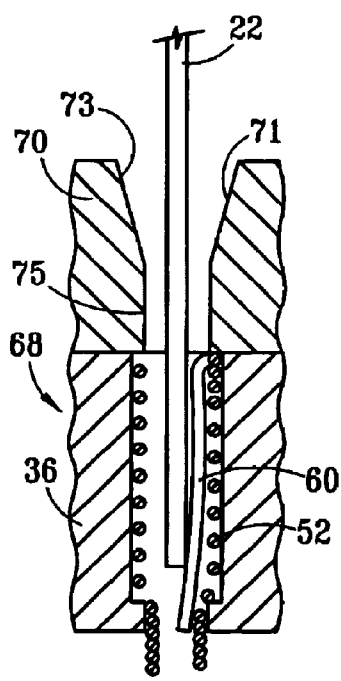
FIG. 9 is a partial section view of an alternative receptacle for mounting to a circuit board, and to which test and burn-in sockets are removably mounted.
Figure 10:
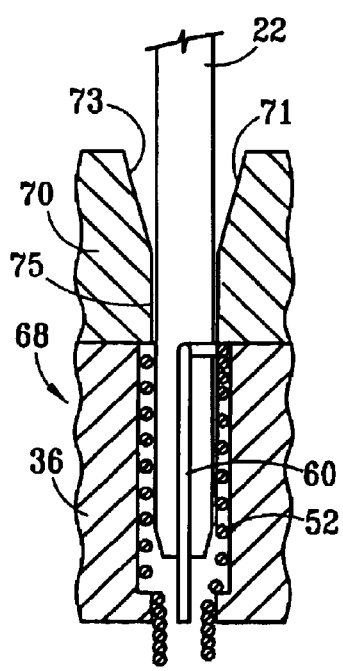
FIG. 10 is a partial section view of a receptacle of FIG. 9, taken along a sectioning plane which is at a right angle to the sectioning plane of FIG. 9.

FIG. 9 is a partial section view of an alternative receptacle 68 for mounting to a circuit board and engaging a contact land of a surface mount board, and to which a conventional test and burn-in sockets are removably mounted. FIG. 10 is a partial section view of the receptacle 16 taken along a sectioning plane which is at a right angle to the sectioning plane of FIG. 9. The receptacle 68 is similar to the receptacle 16, except that an upper housing portion 70 has apertures 71 with profiles that define a tapered profile portion 73 and a straight profile portion 75. The tapered profile portions 71 guide end tails of leads 22 into the straight portions 75 of the apertures 71. The straight portions 75 of the apertures 71 guide the tails of contacts 22 straight into the interior of the coils spring contacts 52 for engaging the contact tangs 60.

Figure 11:
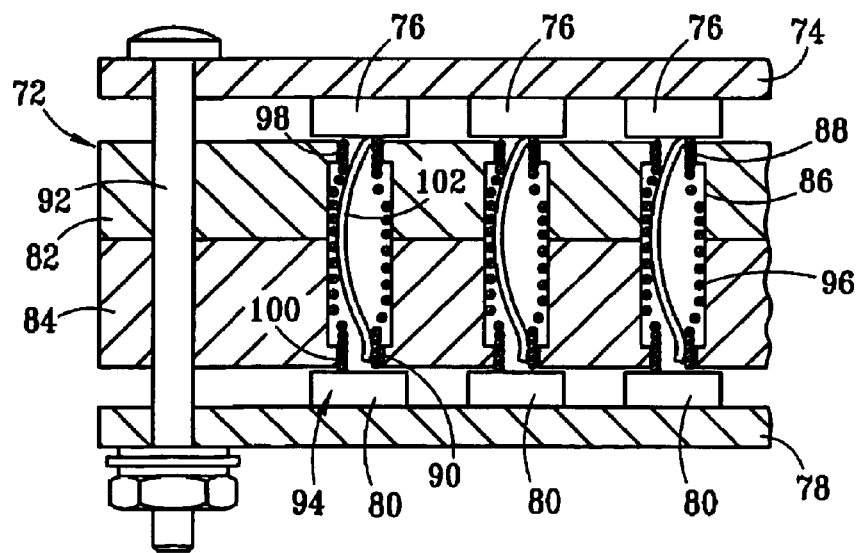
FIG. 11 is a partial section view of an alternative receptacle which includes a second embodiment of a coil spring contact having an interiorly extending contact tang for electrically connecting two surface mount contacts.

FIG. 11 is a partial section view of an alternative receptacle 72 for electrically connecting between a contact 76 of a first device 74, which may be a semiconductor component, connector or printed circuit board, and a contact 80 of a second device 78, which may also be a semiconductor component, a connector or a printed circuit board. The receptacle 72 has a first housing portion 82 and a second housing portion 84 which fit together to define a chamber 86 having ports 88 and 90 on opposite ends. The housings 82 and 84 are preferably formed on an electrical insulating material. The chamber 86 and the two ports 88 and 90 together define an aperture within which a coil spring contact 94 is disposed. The first and second housing portions 82 and 84 are preferably held in place between the devices 74 and 78 by a fastener 92.

The coil spring contact 94 preferably has a loosely wound portion 96, which provides an active portion of the coil spring contact 94 with windings being spaced apart, such that the active, loosely wound portion 96 is compliant for responding to changes in distances and pressure between opposing contacts 76 and 80. The coil spring contact 94 has contact ends defined by opposite ends 98 and 100, which are closely wound, such that peripheries of adjacent coils are touching, making electrical contact through edge contact with adjacent ones the close wound coils 98 and 100. The close wound coils 98 and 100 are preferably wound to a smaller diameter than the loosely wound coils 96. A contact tang 102 is provided by a terminal end of a single length, or piece, of wire which is formed to provide the coil spring contact 94, preferably from the end providing the close wound contact coils 98. The contact tang 102 is turned back inward, such that is extends within the loosely wound, active coil portion 96 of the coil spring contact 94. When the coil spring contact 94 is installed within the chamber 86 of the receptacle housings 82 and 84, the loosely wound, active coils 96 are compressed to preload the coil spring contact 94 to near its desired operating force, which places an end portion of the contact tang 102 in direct engagement with the oppositely disposed, close wound coils 100. The contact tang 102 is preferably formed such that it will extend against and contact the oppositely disposed close wound coil 100. The reduced diameter, close wound coils 98 and 100 of the ends of the coil contact spring 94 are allowed to protrude through respective ones of the ports 88 and 90 in housings 82 and 84 of the receptacle 72.

In some embodiments, the ports 88 and 90 may have openings to accept a non-compliant socket or connector contact tail, such as the end of end tails of the contact 22 show in FIGS. 5–8. When a contact tail is inserted through the port 88 and into the coil spring contact 94, it will preferably directly engage the contact tang 102. Although a contact tail for the contact 22 is shown as being stamped from the flat material, the contact 22 could be of any suitable shape or form. When the receptacle 72 and the device 74, such as a test socket, are mounted on a surface such as the board 78 where an electrical connection is desired, the reduced diameter close wound end 100 of the coil spring 94 is formed against the contact tang 102, and the electrical path through the coil spring 94 is shortened such that and the active, loosely wound coils 94 are not part of the electrical circuit path through the coil spring contacts 94.

Figure 12:
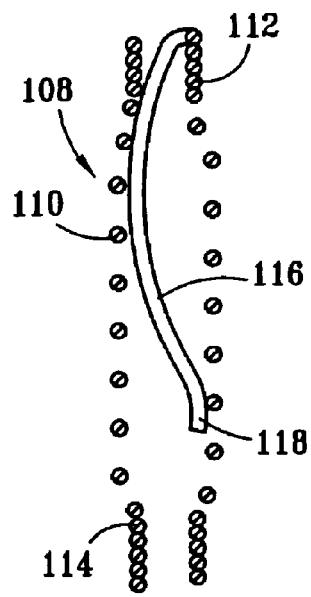
FIG. 12 is a longitudinal section view of a third embodiment of a coil spring contact having an interiorly extending contact tang.
Figure 13:
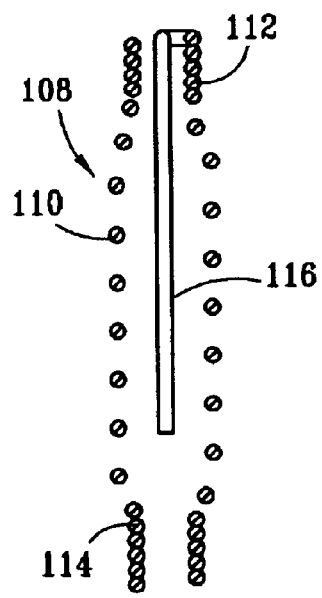
FIG. 13 is a longitudinal section view of the third coil spring contact, taken along a sectioning plane which is at a right angle to the sectioning plane of FIG. 12.

FIG. 12 is a longitudinal section view of a third embodiment of a coil spring contact 108 which may be used to provide a compliant contact. FIG. 13 is a longitudinal section view of the third coil spring contact 108, taken along a sectioning plane which is at a right angle to the sectioning plane from which FIG. 12 is taken. The coil spring contact 108 preferably has loosely wound coils 110, and close wound coils 112 and 114 on opposite ends of the loosely wound coils 110. The loosely wound coils 110 are wound such that the adjacent coils are spaced apart and free to deflect under load, being active coils in providing compliance such that the coil spring contact 108 may be compressed to various lengths under axial loads, that is, under loads which extend along the longitudinal axis of the coil spring contact 108. The close wound coils 112 and 114 are wound to reduced diameters as compared to outside diameters of the loosely wound, active coils 110. The close wound coils 112 and 114 are closely wound, such that edges of adjacent ones of the coils 112 and 114 are touching, making electrical contact there-between to define circuit paths which extend through the adjacent ones of the coils in a substantially straight line. The coil spring contact 108 further includes a contact tang 116 which extends interiorly within the loosely wound, or active, coils 110. Preferably, the coil spring contact 108 is formed of a single length of conductive wire. The contact tang 116 is formed in a curved shape, with an end portion 118 providing a tab for engaging the oppositely disposed, close wound coils 114 when the active, loosely wound coils 110 are placed under compressive loads.

Figure 14:
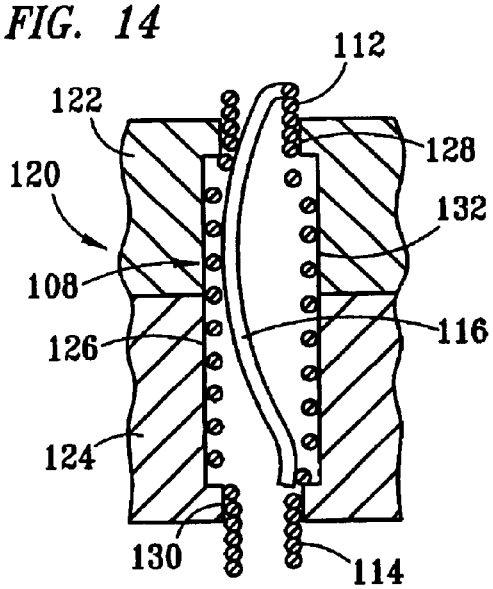
FIG. 14 is a partial section view of the third coil spring contact after being secured within a second insulator housing for use in an alternative receptacle.

FIG. 14 is a partial section view of the third coil spring contact 108 after being secured within insulator housings 122 and 124 of an alternative receptacle 120. The two housings 122 and 124 together define a chamber 126 having ports 128 and 130 on opposite sides. Together, the chamber 126 and the ports 128 and 120 define aperture 132 for receiving the coil spring contact 108. The coil spring contact 108 is disposed within the chamber 126 of the contact housings 122 and 124, with the loosely wound, active coils 110 being compressed between shoulders of the chamber 126 which are adjacent to the ports 128 and 130. The ports 128 and 130 are preferably of a smaller cross-sectional area than the cross-sectional area of the chamber 126, and are of smaller interior diameter than the outer dimension of the loosely wound, active coils 110. The active coils 110 are compressed such that the end portion 118 of the contact tang 116 is disposed against the close wound coils 114, or located near the close wound coils 114, such that the end portion 118 is separated from the close wound coils 130 by a small distance. The close wound ends 112 and 114 of the coil contact spring 108 protrude from opposite sides of the housings 122 and 124.

Figure 15:
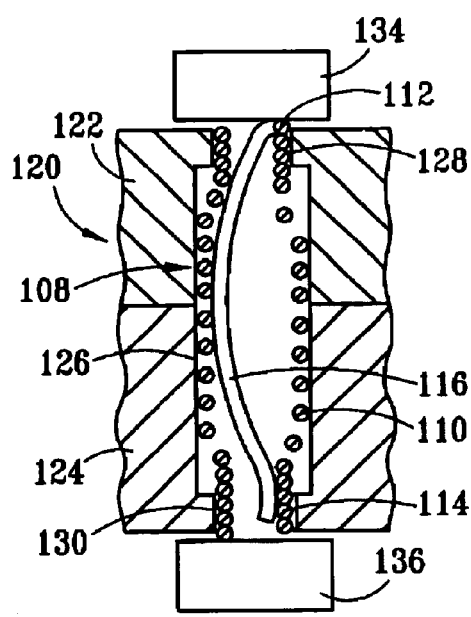
FIG. 15 is a partial section view of the alternative receptacle of FIG. 14 electrically connecting between two surface mount contacts.

FIG. 15 is a partial section view of the alternative receptacle of FIG. 14 electrically connecting between two surface mount contacts 134 and 136. The two contacts 134 and 136 will press against respective ones of the close wound coils 112 and 114, loading the active, loosely wound coils 110 to compress the contact spring 108 and urge the end portion 118 of the contact tang 116 within the close wound coil 114. The electrical circuit path through the coil spring contact 108 will then be from the close wound coils 112, through the contact tang 116 and to the close wound contact coils 114. The contact tang 116 provides a substantially lineal circuit path, as opposed to a circuit path through the active portion of the coil spring contact 108, that is, through the loosely wound coils 110. Preferably, the lineal circuit path through the contact tang 116 provides a circuit path which is substantially geometrically lineal, or substantially in a straight line, which provides a more reliable high frequency test circuit than if the active, loosely wound coils 110 were included in the circuit path as an inductor.

Figure 16:
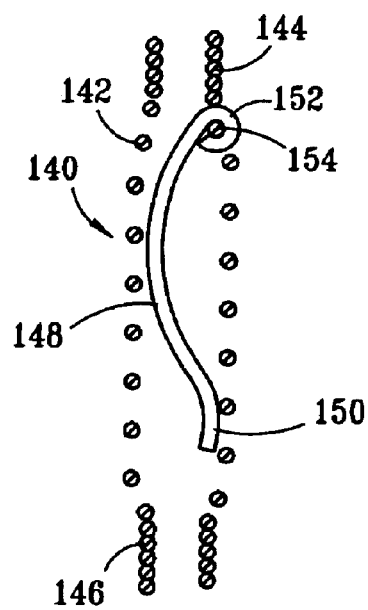
FIG. 16 is a partial section view of a fourth embodiment of a coil spring contact having an interiorly extending contact tang.
Figure 17:
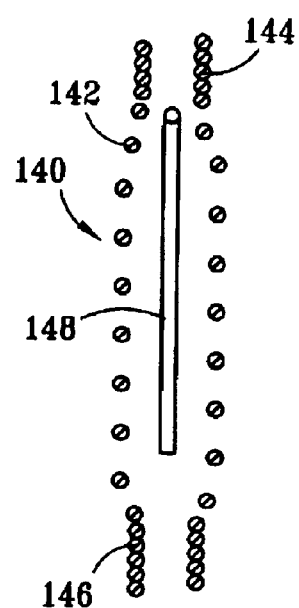
FIG. 17 is a longitudinal section view of the fourth coil spring contact, taken along a sectioning plane which is at a right angle to the sectioning plane of FIG. 16.

FIG. 16 is a longitudinal section view of a fourth embodiment of a coil spring contact 140 which may be used to provide a compliant contact. FIG. 17 is a longitudinal section view of the fourth coil spring contact 140, taken along a sectioning plane which is at a right angle to the sectioning plane of FIG. 16. The coil spring contact 140 preferably has loosely wound coils 142, and close wound coils 144 and 146 on opposite ends of the loosely wound coils 142. The loosely wound coils 142 are wound such that the adjacent coils are spaced apart and free to deflect under axial loads, being active coils in providing compliance such that the coil spring contact 140 may be compressed to various lengths. The close wound coils 144 and 146 are wound to reduced diameters as compared to the loosely wound, active coils 142. The close wound coils 144 and 146 are closely wound, such that edges of adjacent ones of the coils are touching, making electrical contact there-between to define circuit paths which extend through the adjacent ones of the coils in a substantially straight line. The close wound coils 144 and 146 preferably define contact ends for the coil spring contact 140, each directly contacting a respective one of the first and second contacts 170 and 172 (shown in FIG. 19). The coil spring contact 140 further includes a contact tang 148 which extends interiorly within the loosely wound, or active, coils 142. Preferably, the coil spring contact 140 is formed of a single length of conductive wire. The contact tang 148 is formed from a separate piece of conductive wire from that of the loosely wound coil 142, and the tightly wound coils 144 and 146. The contact tang 148 is formed in a curved shape, with an end portion 150 providing a tab for engaging the opposite close wound coils 146 when the active, loosely wound coils 142 are placed under compressive loads. The opposite end of the contact tang 148 is formed into a loop 152 which wraps around a coil 154, which is one of the loosely wound coils 142. The contact tang 148 extends within the active, loosely wound coils 142, and is crimped onto the coil 154 by the loop 152, which is disposed adjacent to and contacting the close wound coils 144. In other embodiments, other suitable attachment means other than crimping may be used, such brazing, soldering, adhesively securing, and the like. Additionally, other suitable form shapes may be used for the coil spring contacts 140 and for the contact tangs 150 than that shown in the referenced drawing figures.

Figure 18:
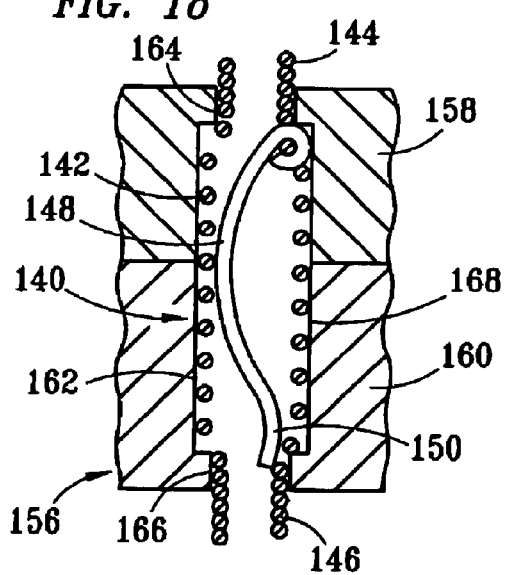
FIG. 18 is a partial section view of an alternative receptacle, which includes the fourth coil spring contact.

FIG. 18 is a partial section view of the fourth coil spring contact 140 after being secured within insulator housings 158 and 160 of an alternative receptacle 156. The two housings 158 and 160 together define a chamber 162 having ports 164 and 166 on opposite sides. The ports 164 and 166 are preferably of a smaller cross-sectional area than the cross-sectional area of the chamber 162. Together, the chamber 162, and the ports 164 and 166 define an aperture 168 for receiving the coil spring contact 140. The coil spring contact 140 is disposed within the chamber 162 of the contact housings 158 and 160, with the loosely wound, active coils 142 being compressed between oppositely disposed shoulders of the chamber 152 which are adjacent to the ports 164 and 166, respectively. The ports 164 and 166 are of smaller interior diameter than the outer dimension of the loosely wound, active coils 142. The active coils 142 are compressed such that the end portion 150 of the contact tang 148 is disposed against the close wound coils 146, or located near the close wound coils 146 such that the end portion 150 is separated from the coils 146 by a small distance, until an axial load is applied from engaging mating contacts to push the end portion 150 into close contact with close wound coils 146. The ends of the close wound coils 144 and 146 protrude from opposite sides of the housings 158 and 160.

Figure 19:
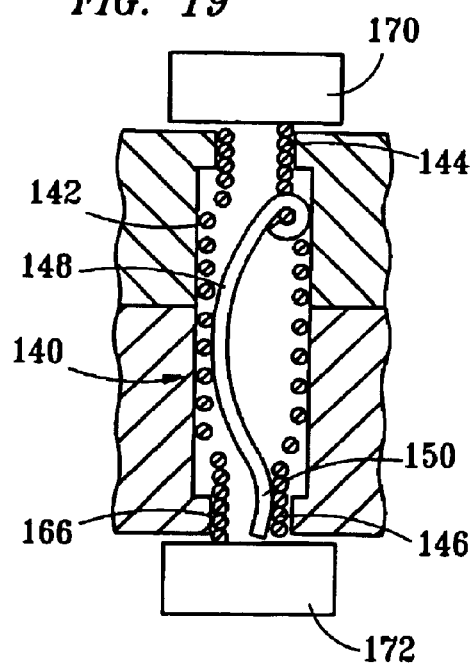
FIG. 19 is a partial section view of the alternative receptacle of FIG. 18 electrically connecting between two surface mount contacts.

FIG. 19 is a partial section view of the alternative receptacle of FIG. 18 electrically connecting between two surface mount contacts 170 and 172. The two contacts 170 and 172 will press against respective ones of the close wound coils 144 and 146, loading the active, loosely wound coils 142 to compress the coil spring contact 140 and urge the end portion 150 of the contact tang 148 interiorly within and to press against the close wound coils 146. The electrical circuit path through the coil spring contact 140 will then be from the close wound coils 144, through the contact tang 148 and to the close wound coils 146. The contact tang 148 provides a substantially lineal circuit path, as opposed to a circuit path through the active portion of the coil spring contact 140, that is, through the loosely wound coils 142. The lineal circuit path through the contact tang 148 preferably provides a circuit path which is substantially geometrically lineal, or substantially in a straight line, which provides a more reliable high frequency test circuit than if the active, loosely wound coils 142 were included in the circuit path.

FIG. 20 is a longitudinal section view of a fifth embodiment of a coil spring contact 180 which may be used to provide a compliant contact. FIG. 21 is a longitudinal section view of the fifth coil spring contact 180, taken along a sectioning plane which is at a right angle to the sectioning plane of FIG. 20. The coil spring contact 180 preferably has loosely wound coils 182, and close wound coils 184 and 186 on opposite ends of the loosely wound coils 182. The loosely wound coils 182 are wound such that the adjacent coils are spaced apart and free to deflect under load, being active coils in providing compliance such that the coils spring contact 180 may be compressed to various lengths. The close wound coils 184 and 186 are wound to reduced diameters as compared to the loosely wound, active coils 182. The close wound coils 184 and 186 are closely wound, such that edges of adjacent ones of the coils 184 and 186 are touching, making electrical contact there-between to define circuit paths which extend through the adjacent ones of the coils in a substantially straight line. The close wound coils 184 and 186 define contact ends of the coil spring contact 180, which directly engage against the contacts 210 and 212 (shown in FIG. 23). The coil spring contact 180 further includes a contact tang member 188 which extends within the loosely wound coils 182 as a separate member disposed within the loosely wound, active coils 182. The contact tang member 188 is preferably free to move separately from the loosely wound active coils 182. Preferably, the loosely wound coils 182, and the close wound coils 184 and 186 of the coil spring contact 180 are formed of a single length of conductive wire. The contact tang member 188 is formed from a separate piece of conductive wire from that of the loosely wound coil 182, and the tightly wound coils 184 and 186. The contact member 188 is formed with a straight, central portion 190 and two end portions 192 and 194, which preferably are formed to have U-shaped profiles. The end portions 192 and 194 are formed for engaging the opposite, close wound coils 184 and 186 when the active, loosely wound coils 182 are placed under compressive loads. The separate wire from piece providing the loose, or free-floating, contact tang member 188 may be formed in other suitable shapes and forms.

FIG. 22 is a partial section view of the fifth coil spring contact 180 after being secured within insulator housings 198 and 200 of an alternative receptacle 196. The two housings 198 and 200 together define a chamber 202 having ports 204 and 206 on opposite sides. The ports 204 and 200 are preferably of a smaller cross-sectional area than the cross-sectional area of the chamber 202. Together, the chamber 202, and the ports 204 and 206 define an aperture 208 for receiving the coil spring contact 180. The coil spring contact 180 is disposed within the chamber 202 of the contact housings 198 and 200, with the loosely wound, active coils 182 being compressed between spaced apart, opposing shoulders of the chamber 202 which are adjacent to respective ones of the ports 204 and 206. The ports 204 and 206 are of smaller interior diameter than the outer dimension of the loosely wound, active coils 182. The active coils 182 are compressed such that the end portions 192 and 194 of the contact tang 188 are disposed against the close wound coils 184 and 186, or located near the close wound coils 184 and 186 such that the end portions 192 and 194 are separated from the coils 184 and 186 by a small distance, prior to the contact coil 180 being placed under axial loads from engaging mating contacts 210 and 212. The close wound ends 184 and 186 of the coil contact spring 180 protrude from opposite sides of the housings 198 and 200.

FIG. 23 is a partial section view of the alternative receptacle of FIG. 22 electrically connecting between two surface mount contacts 210 and 212. The two contacts 210 and 212 will press against respective ones of the close wound coils 184 and 186, loading the active, loosely wound coils 182 to compress the contact spring 180 and urge the end portions 192 and 194 of the contact tang 188 within and into contact with the close wound coils 184 and 186, respectively. The electrical circuit path through the coil spring contact 180 will then be from the close wound coils 184, through the contact tang 188 and to the close wound coils 186. The contact tang 188 provides a substantially lineal circuit path, as opposed to a circuit path through the active portion of the coil spring contact 180, that is, through the loosely wound coils 182. Preferably, the lineal circuit path through the contact tang 188 provides a circuit path which is substantially geometrically lineal, which provides a more reliable high frequency test circuit than if the active, loosely wound coils 182 were included in the circuit path.

Figure 24:
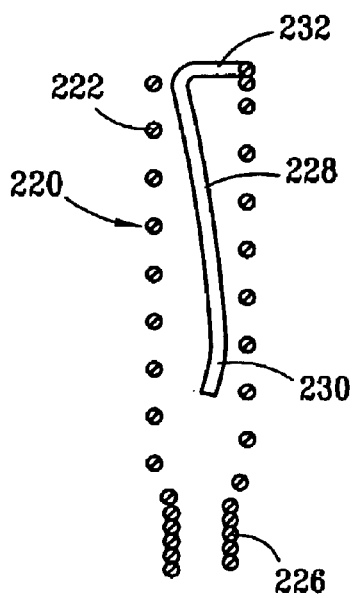
FIG. 24 is a longitudinal section view of a sixth embodiment of a coil spring contact having an interiorly extending contact tang.
Figure 25:
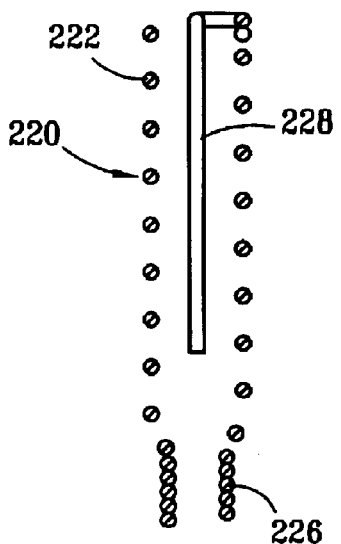
FIG. 25 is a longitudinal section view of the sixth coil spring, taken along a sectioning plane which is at a right angle to the sectioning plane of FIG. 24.

FIG. 24 is a longitudinal section view of a sixth embodiment of a coil spring contact 220 which may be used to provide a compliant contact. FIG. 25 is a longitudinal section view of the sixth coil spring contact 220, taken along a sectioning plane which is at a right angle to the sectioning plane of FIG. 24. The coil spring contact 220 preferably has loosely wound coils 222 located on a first end 232, and close wound coils 226 located on a second end of coil spring contact 220. The loosely wound coils 222 are wound such that the adjacent coils are spaced apart and free to deflect under load, being active coils in providing compliance such that the coils spring contact 220 may be compressed to various lengths under axial loads. The close wound coils 226 are wound to reduced diameters as compared to the loosely wound, active coils 222. The close wound coils 226 are closely wound, such that peripheries, or edges of adjacent ones coils are touching, making electrical contact there-between to define circuit paths which extend through the adjacent ones of the coils in a substantially straight line. The close wound coil 226 and the first coil 232 define contact ends for the coil spring contact 220. The coil spring contact 220 further includes a contact member 228 which extends within the loosely wound coils 222 as a contact tang, disposed within the loosely wound, active coils 222. The contact member 228 is preferably formed one an end of the loosely wound coils 222 which is opposite from close wound coils 226. In other embodiments, the contact member 228 may be free-floating, or loose, within the loosely would coils 222. Preferably, the loosely wound coils 222, the close wound coils 226 and the contact member 228 of the coil spring contact 220 are formed of a single length of conductive wire. One end of the contact member 228 has an end portion 230 for engaging the close wound coils 226. The opposite end of the contact member 228 preferably is formed to extend from the first coil 232, which is a terminal end coil of the loosely wound coils 222.

Figure 26:
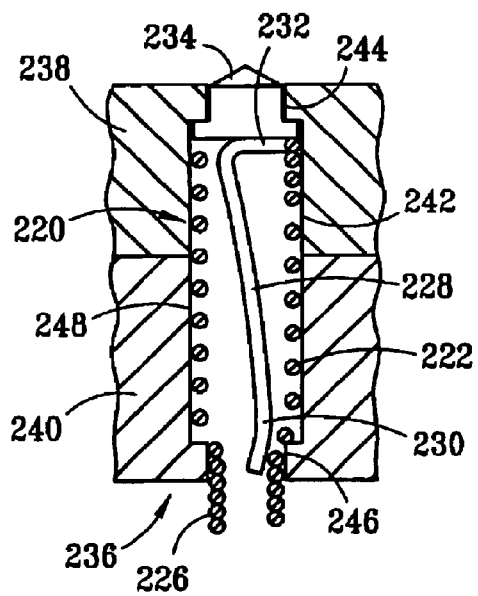
FIG. 26 is a partial section view of an alternative receptacle, having the sixth coil spring contact and a contact button.

FIG. 26 is a partial section view of the sixth coil spring contact 220 after being secured within insulator housings 238 and 240 of an alternative receptacle 236. The two housings 238 and 240 together define a chamber 242 having ports 244 and 246 on opposite sides. The ports 244 and 240 are preferably of a smaller cross-sectional area than the cross-sectional area of the chamber 242. Together, the chamber 242, and the ports 244 and 246 define an aperture 248 for receiving the coil spring contact 220 and a contact button 234. The contact button 234 is shown as a loose piece of metal shaped as shown, but other conductive members may be used, some of which are secured to the coil spring contact 220. The coil spring contact 220 and the contact button 234 are disposed within the chamber 242 of the contact housings 238 and 230, with the loosely wound, active coils 222 being compressed between opposite, facing shoulders of the chamber 242 which are adjacent to respective ones of the ports 244 and 246. The ports 244 and 246 are of smaller interior diameter than the outer dimension of the loosely wound, active coils 222. The active coils 222 are compressed such that the end portion 230 of the contact tang 228 is disposed against the close wound coils 226, or located near the close wound coils 226 such that the end portion 230 is separated from the close wound coils 226 by a small distance until placed under axial loads from engaging mating contacts 250 and 252 (shown in FIG. 27). The close wound end 226 of the coil contact spring 220 protrudes through the port 246 and from a side of the housing 240, and the button contact 234 protrudes through the port 244 and from an opposite side of the housing 238. The button contact 234 has a flange which fits within the chamber 242, but which is larger than the port 244, such that the button contact 234 is retained within the aperture 248.

Figure 27:
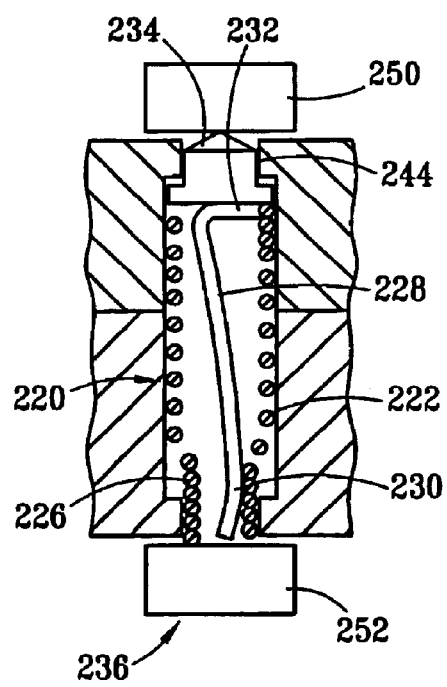
FIG. 27 is a partial section view of the alternative receptacle of FIG. 26 electrically connecting between two surface mount contacts.

FIG. 27 is a partial section view of the alternative receptacle of FIG. 26 electrically connecting between the two surface mount contacts 250 and 252. The two contacts 250 and 252 will press against respective ones of the close wound coils 226 and the button contact 234, loading the active, loosely wound coils 222 to compress the contact spring 220 and urging the end portion 230 of the contact tang 228 within the close wound coil 226. The electrical circuit path through the coil spring contact 220 will then be from the button contact 234, through the contact tang member 228, and through the close wound contact coil 226 to the contact 252. The contact tang member 228 and the button contact 234 together provide a substantially lineal circuit path, as opposed to a circuit path passing through the active portion of the coil spring contact 220, that is, through the loosely wound coils 222. The circuit path through the contact member 228 and the button contact 234 preferably provides a circuit path which is substantially geometrically lineal, or substantially in a straight line, which provides a more reliable high frequency test circuit than if the active, loosely wound coils 222 were included in the circuit path as an inductor.

Figure 28:
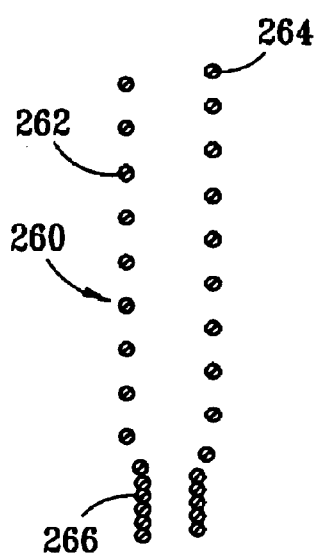
FIG. 28 is a longitudinal section view of a seventh embodiment of a coil spring contact.
Figure 29:
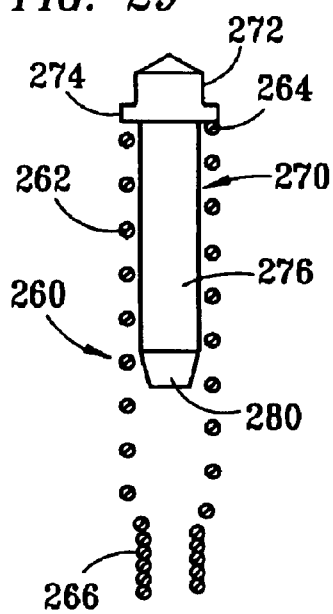
FIG. 29 is a longitudinal section view of the seventh coil spring of FIG. 28, with a contact button having a contact tang which extends interiorly within the seventh coil spring contact.

FIG. 28 is a longitudinal section view of a seventh embodiment of a coil spring contact 260 which may be used to provide a compliant contact. FIG. 29 is a longitudinal section view of the seventh coil spring contact 260, taken along a sectioning plane which is at right angle to the sectioning plane of FIG. 28. The coil spring contact 260 preferably has loosely wound coils 262, and close wound coils 266 located on one end of the coil spring contact 260. The loosely wound coils 262 are wound such that adjacent coils are spaced apart and free to deflect under load, providing compliance such that the coils spring contact 260 may be compressed to various lengths under axial loads. An end 264 of the loosely wound coils 262 defines a first end of the coil spring contact. The close wound coils 266 are wound to reduced diameters as compared to the loosely wound, active coils 262. The close wound coils 266 are closely wound, such that peripheries of adjacent ones the coils are touching, making electrical contact there-between to define circuit paths which extend through the adjacent ones of the coils in a substantially straight line. The close wound coils 266 and an end 264 define opposite, contact ends for the coil spring contact 260. Preferably, the close wound coils 266 directly engage a mating contact 298 (shown in FIG. 31) and the end 264 directly engages against the contact tang member 270. The coil spring contact 260 further includes a contact tang member 270 which extends within the loosely wound coils 262. The contact member 270 is preferably a free-floating, or loose, conductive member having a contact button head 272 and a shank 276. The shank 276 extends interiorly within the loosely wrapped coils 262. The heat 272 defines a button contact which includes an annular-shaped flange 274 adjacent to the end of the shank 276. The button contact head 272 is preferably disposed on an opposite end of the coil spring contact 260 from the close wound coils 266. The contact tang member 270 is shown as a loose piece of metal shaped to include a button contact head 272 and a shank 276, but other types of conductive members may be used, some of which may be affixed to the coil spring contact 260. Preferably, the loosely wound coils 262 and the close wound coils 266 are formed of a single length of conductive wire. One end of the contact tang member 270 has an end portion 280 for engaging the close wound coils 266.

Figure 30:
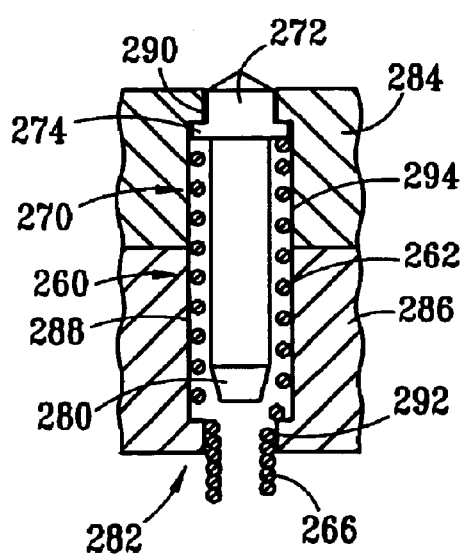
FIG. 30 is a partial section view of an alternative receptacle, having the seventh coil spring contact with the contact button having a contact tang disposed within the seventh coil spring contact.

FIG. 30 is a partial section view of the seventh coil spring contact 260 and the contact member 270 after being secured within insulator housings 284 and 286 of an alternative receptacle 282. The two housings 284 and 286 together define a chamber 288 having ports 290 and 292 on opposite sides. The ports 290 and 292 are preferably of a smaller cross-sectional area than the cross-sectional are of the chamber 288. Together, the chamber 288, and the ports 290 and 292 define an aperture 294 for receiving the coil spring contact 260 and the contact member 270. The coil spring contact 260 and the contact member 270 are disposed within the chamber 288 of the contact housings 284 and 286, with the loosely wound, active coils 262 being compressed between opposite shoulders of the chamber 282 which are adjacent to the ports 290 and 292. The ports 290 and 292 are of smaller interior diameter than the outer dimension of the loosely wound, active coils 262. The active coils 262 are compressed such that the end portion 280 of the contact member 270 is disposed against the close wound coils 266, or located near the close wound coils 266 such that the end portion 280 is separated from the close wound coils 266 by a small distance, until placed under axial loads from engaging the mating contacts 296 and 298. The close wound end 266 of the coil contact spring 260 protrudes from one end of the housing 286 and the head or button contact 272 of the contact member 270 produces from an opposite side of the housing 284. The annular-shaped flange 274 of the button contact 272 slidably fits within the chamber 282, but is larger than the port 290, such that the contact member 270 is retained within the aperture 294.

Figure 31:
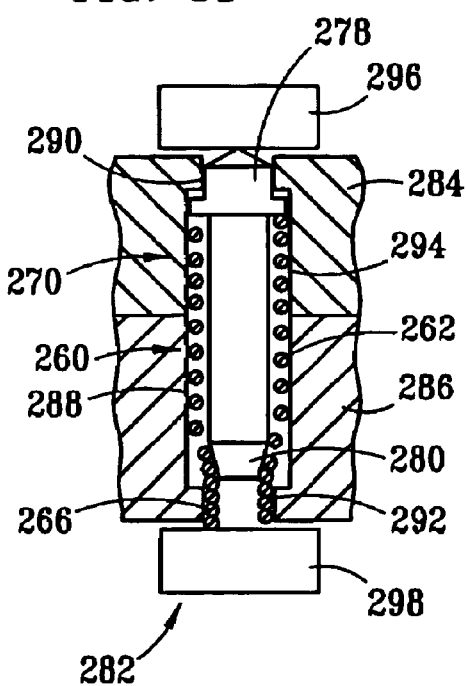
FIG. 31 is partial section view of the alternative receptacle of FIG. 30 electrically connecting between two surface mount contacts.

FIG. 31 is a partial section view of the alternative receptacle 282 of FIG. 30 electrically, connecting between two surface mount contacts 296 and 298. The two contacts 296 and 298 will press against respective ones of the close wound coils 266 and the button contact 272 located on the end of the contact member 270, loading the active, loosely wound coils 262 to compress the coil spring contact 260 to urge the end portion 280 of the contact member 270 within the close wound coils 266. The electrical circuit path through the coil spring contact 260 will then be from the contact 296, through the contact member 270 and the close wound contact coil 266, and to the contact 298. The contact member 270 and the close wound coils 266 together provide a substantially lineal circuit path, as opposed to a circuit path through the active portion of the coil spring contact 260, that is, through the loosely wound coils 262. The lineal circuit path through the contact member 270 and the close wound coils 266 preferably provides a circuit path which is substantially geometrically lineal, or substantially in a straight line, providing a more reliable high frequency test circuit than if the active, loosely wound coils 262 were included in the circuit path.

Figure 32:
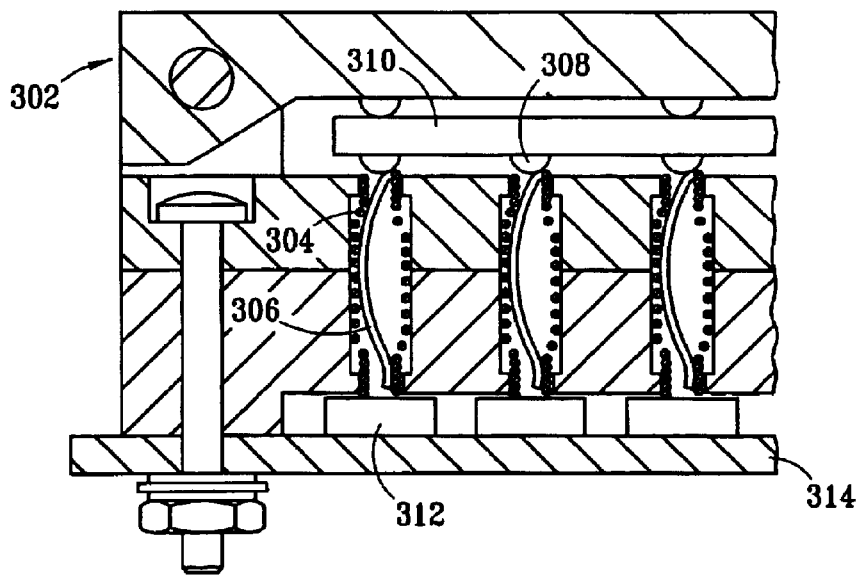
FIG. 32 is a partial section view of a lid-type test and burn-in socket having helical coil spring contacts with interiorly disposed contact tangs.

FIG. 32 is a partial section view of a lid-type test and burn-in socket 302 having helical coil spring contacts 304 with interiorly disposed contact tangs 306. The housing of the socket 302 may be as shown above for various ones of the receptacles described herein-above. Similarly, the spring contact 304 and the contact tangs 306 may be provided in the various forms shown herein, including those with free floating contact tangs and also including those with button contacts. Preferably, the socket 302 will have spring helical coil spring contacts 304 which directly connect mating contacts 308 of components 310 under test, and the contacts 312 of a circuit board 314 to which the socket 302 is mounted. The socket 302 can be bolted to the circuit board 314 with the contacts 304 providing a compression electrical connection, or the socket 302 can be secured to the contacts 312 by solder re-flow.

Figure 33:
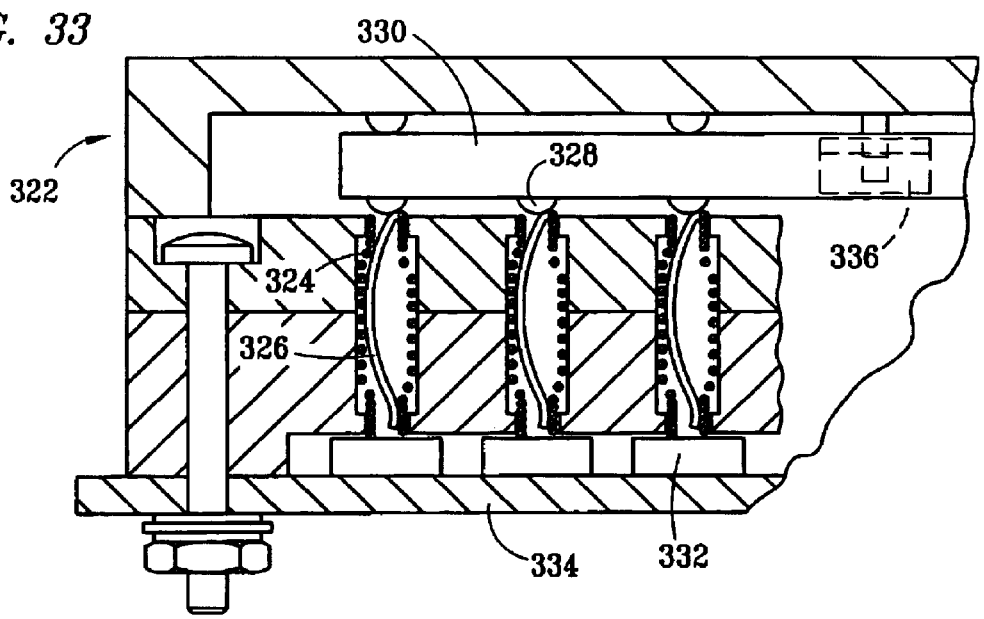
FIG. 33 is a partial section view of a lidless latch type test and burn-in socket having helical coil spring contacts with interiorly disposed contact tangs.

FIG. 33 is a partial section view of a lidless latch type test and burn-in socket 322 having a component latch 336. The socket 322 has helical coil spring contacts 324 with interiorly disposed contact tangs 326. The housing of the socket 322 may be as shown above for various ones of the receptacles described herein-above. Similarly, the spring contact 324 and the contact tangs 326 may be provided in the various forms shown herein, including those with free floating contact tangs and also including those with button contacts. Preferably, the socket 322 will have spring helical coil spring contacts 324 which directly connect mating contacts 328 of components 330 under test, and the contacts 332 of a circuit board 334 to which the socket 322 is mounted.

Figure 34:
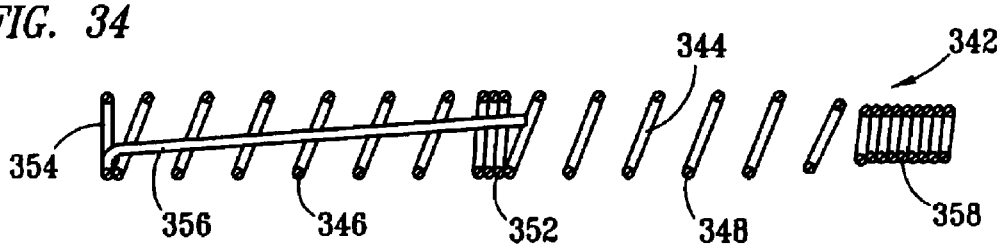
FIG. 34 is a longitudinal section view of an eighth helical coil compression spring for use as a coil spring contact having a lineal contact member.

FIG. 34 is a longitudinal section view of an eighth helical coil compression spring 342 for use as a coil spring contact having a lineal contact member 356. The helical coil compression spring 342 is preferably formed from a singular spring wire 344, which is preferably composed of a beryllium-copper alloy. The coil spring 342 has loosely wound coils 346 and 348, with close wound coils 352 provided intermediate of the loosely wound coils 346 and 348. Providing the close wound coils 352 intermediate of the loosely wound coils 346 and 348 prevents a batch of coil springs 342 from becoming tangled if shipped loosely in a single package. The coil spring 342 further includes an end from which a contact tang 356 extends interiorly within the loosely wound coils 346 and the close wound coils 352. Close wound coils 358 are provide on an opposite end of the coils spring contact 342 from the end 354, and are closely spaced such that adjacent coils are in contact to provide a lineally straight circuit path through the close wound coils 358. When the coil spring contact 342 is placed under axial loads, the loosely wound coils 346 and 348 will be compressed, such that the contact tang 356 will extend from the end 354 and directly engage the close wound coils 358, providing a substantially lineal circuit path from the end 354 to the close wound coils 358.

Although the preferred embodiment has been described in detail, it should be understood that various changes, substitutions and alterations can be made therein without departing from the spirit and scope of the invention as defined by the appended claims.

What is claimed is:

1. An apparatus for electrically connecting first contacts to respective ones of second contacts, the apparatus comprising:

a housing having a plurality of apertures, said apertures extending between respective ones of the first and second contacts, a plurality of coil spring contacts disposed in respective ones of said apertures of said housing, said coil spring contacts having loosely spaced coils which extend between respective ones of the first and second contacts, said loosely spaced coils being compliant for conforming to movement of respective ones of the first contacts relative to the second contacts; and a plurality of contact tangs extending interiorly within respective ones of said coil spring contacts and through at least part of an active portion of respective ones of said loosely spaced coils, wherein each of said contact tangs have at least one moveable end which is slidably moveable relative a terminal end of a respective one of said coil spring contacts such that said contact tangs extend across said active portions of said loosely spaced coils which extend between the first and second contacts to define substantially lineal circuit paths which extend interiorly through said active portions of said loosely spaced coils to electrically connect between respective ones of the first and second electrical contacts.

2. The apparatus according to claim 1, wherein said contact tangs engage directly against said second contacts to electrically connect said first contacts to said second contacts.

3. The apparatus according to claim 1, wherein said substantially lineal circuit paths of said contact tangs extend in a substantially straight line.

4. An apparatus for electrically connecting first contacts to respective ones of second contacts, the apparatus comprising:
 a housing having a plurality of apertures, said apertures extending between respective ones of the first and second contacts;
 a plurality of coil spring contacts disposed in respective ones of said apertures of said housing, said coil spring contacts having loosely spaced coils which extend between respective ones of the first and second contacts, said loosely spaced coils being compliant for conforming to movement of respective ones of the first contacts relative to the second contacts;
 a plurality of contact tangs extending interiorly within respective ones of said coil spring contacts and through at least part of respective ones of said loosely spaced coils, said contact tangs defining substantially lineal circuit paths which extend interiorly through said loosely spaced coils to electrically connect between respective ones of the first and second electrical contacts; and
 wherein said coil spring contacts are defined by helically wound, conductive wires having first end portions and intermediate portions, said intermediate portions being wound to define said loosely spaced coils, and said first end portions being formed to define respective ones of said contact tangs which extend interiorly within said loosely spaced coils.

5. The apparatus according to claim 4, wherein said second end portions of said coil spring contacts comprise close wound coils, such that adjacent coils directly contact to provide substantially straight circuit paths through said close wound coils, and said contact tangs directly contact respective ones of said close wound coils to define said lineal circuit paths between said first and second contacts.

6. The apparatus according to claim 1, wherein said first contacts are through-hole leads which extend into respective ones of said apertures in said housing, directly engaging against respective ones of said contact tangs.

7. The apparatus according to claim 1, wherein said contact tangs are separate members from said coils springs, and said contact tangs extend interiorly within respective ones of said coil contacts.

8. The apparatus according to claim 7, wherein said contact tangs each have a head and shank, said head contacting the first contact and said shank extending within said loosely spaced coils for contacting a contact end of said coil springs.

9. The apparatus according to claim 1, further comprising contact buttons disposed within respective ones of said apertures, adjacent to first ends of respective ones of said coil spring contacts and extending from said apertures to directly engage against said first contacts.

10. An apparatus for electrically connecting first contacts to respective ones of second contacts, the apparatus comprising:
 a housing having a plurality of apertures, said apertures registering with the first contacts and extending between respective ones of the first and second contacts;
 a plurality of coil spring contacts disposed in respective ones of said apertures of said housing, said coil spring contacts having contact ends and loosely spaced coils which extend between respective ones of the first and second contacts, said loosely coils extending between said contact ends and being compliant for conforming to movement of respective ones of the first contacts relative to the second contacts; and
 a plurality of contact tangs extending interiorly within respective ones of said coils spring contacts and through at least part of respective ones of active portions of said loosely spaced coils, wherein each of said contact tangs have at least one moveable end which is slidably moveable relative to at least one of said contact ends of a respective one of said coil spring contacts such that said contact tangs extend across said active portions of said loosely spaced coils which extend between the first and second contacts to define substantially lineal circuit paths which extend interiorly through said loosely spaced coils to electrically connect to respective ones of said contact ends and between respective ones of the first and second electrical contacts.

11. An apparatus for electrically connecting first contacts to respective ones of second contacts, the apparatus comprising:
 a housing having a plurality of apertures, said apertures registering with the first contacts and extending between respective ones of the first second contacts;
 a plurality of coil spring contacts disposed in respective ones of said apertures of said housing, said coil spring contacts having contact ends and loosely spaced coils which extend between respective ones of the first and second contacts, said loosely spaced coils extending between said contact ends and being compliant for conforming to movement of respective ones of the first contacts relative to the second contacts;
 a plurality of contact tangs extending interiorly within respective ones of said coil spring contacts and through at least part of respective ones of said loosely spaced coils to define substantially lineal circuit paths which extend interiorly through said loosely spaced coils to electrically connect to respective ones of said contact ends and between respective ones of the first and second electrical contacts; and
 wherein said contact ends comprising close wound coils, such that adjacent coils directly contact to provide a substantially straight circuit path through said close wound coils, and said contact tangs directly contact respective ones of said close wound coils to define said lineal circuit path between said first and second contacts.

12. The apparatus according to claim 10, wherein said contact tangs are defined by first end portions of respective ones of said coil spring contacts, said first end portions being formed to extend interiorly within said loosely spaced coils of respective ones of said coil spring contacts, intermediate of said first and second ends.

13. The apparatus according to claim 10, wherein said contact tangs are defined by conductive members which are separate members from said loosely spaced coils.

14. The apparatus according to claim 13, wherein said contact tangs each have a head and shank, said head contacting the first contact, and said shank extending within said loosely spaced coils for contacting a respective one of said contact ends of said coil springs, said contact end connecting said shank to said second contact.

15. The apparatus according to claim 10, further comprising contact buttons disposed within respective ones of said apertures, adjacent to said contact ends of a respective one of said coil springs, and extending from said apertures to directly engage against said first contacts.

16. A test socket for receiving electronic components and electrically connecting first contacts of the components to respective ones of second contacts of test circuitry, the test socket comprising:

a housing having a plurality of apertures, said apertures registering with the first contacts and extending between respective ones of the first and second contacts;

a plurality of coil spring contacts disposed in respective ones of said apertures of said housing, said coil spring contacts having contact ends and loosely spaced coils which extend between respective ones of the first and second contacts, said loosely spaced coils extending between said contact ends and being compliant for conforming to movement of respective ones of the first contacts relative to the second contacts; and a plurality of contact tangs extending interiorly within respective ones of said coil spring contacts and through at least part of respective ones of active portions of said loosely spaced coils, wherein each of said contact tangs have at least one moveable end which is slidably moveable relative to at least one of said contact ends of a respective one of said coil spring contacts such that said contact tangs extend across said active portions of said loosely spaced coils which extend between the first and second contacts to define substantially lineal circuit paths which extend interiorly through said loosely spaced coils to electrically connect to respective ones of said contact ends and between respective ones of the first and second electrical contacts.

17. A test socket for receiving electronic components and electrically connecting first contacts of the components to respective ones of second contacts of test circuitry, the test socket comprising:

a housing having a plurality of apertures, said apertures registering with the first contacts and extending between respective ones of the first and second contacts;

a plurality of coil spring contacts disposed in respective ones of said apertures of said housing, said coil spring contacts having contact ends and loosely spaced coils which extend between respective ones of the first and second contacts, said loosely spaced coils extending between said contact ends and being compliant for conforming to movement of respective ones of the first contacts relative to the second contacts; and a plurality of contact tangs extending interiorly within respective ones of said coil spring contacts and through at least part of respective ones of said loosely spaced coils to define substantially lineal circuit paths which extend interiorly through said loosley spaced coils to electrically connect to respective ones of said contact ends and between respective ones of the first and second electrical contacts; and wherein said contact ends comprising close wound coils, such that adjacent coils directly contact to provide a substantially straight circuit path, and said contact tangs directly contacting respective ones of said close wound coils to define said lineal circuit paths between said first and second contacts.

18. The test socket according to claim 16, wherein said contact tangs are defined by first end portions of respective ones of said coil spring contacts, said first end portions being formed to extend interiorly within said loosely spaced coils of respective ones of said coil spring contacts, intermediate of said first and second ends.

19. The apparatus according to claim 16, wherein said contact tangs are defined by conductive members which are separate members from said loosely spaced coils.

20. The apparatus according to claim 19, wherein said contact tangs each have a head and shank, said head contacting the first contact and said shank extending within said loosely spaced coils for contacting a respective one of said contact ends of said coil springs, said contact end connecting said shank to said second contact.

21. The test socket according to claim 16, further comprising contact buttons disposed within respective ones of said apertures, adjacent to said contact ends of a respective one of said coil springs, and extending from said apertures to directly engage against said first contacts.

22. A method for receiving electronic components in a test socket and electrically connecting first contacts of the components to respective ones of second contacts of test circuitry, the method comprising the steps of:

providing a housing having a plurality of apertures, the apertures registering with the first contacts and extending between respective ones of the first and second contacts;

providing a plurality of coil spring contacts having contact ends and loosely spaced coils extending between the contact ends, the loosely spaced coils being compliant for conforming to movement of respective ones of the first contacts relative to the second contacts; and disposing the coil spring contacts in respective ones of the apertures of the housing, such that the loosely spaced coils extend between the contact ends;

disposing a plurality of contact tangs to extend interiorly within respective ones of the coil spring contacts, through at least part of respective ones of the loosely spaced coils, such that the contact tangs each have at least one terminal end which is slidably moveable to at least one of the contact ends of a respective one of the coil springs to connect across an active portion of the loosely spaced coils of the respective one of the coils springs and define substantially lineal circuit paths which extend interiorly through the loosely spaced coils to electrically connect the first contact to the second contact; and placing the electronic component in the test socket with the first contacts of the component registering with respective ones of the apertures of the housing and electrically connecting to respective ones of the coil spring contacts, such that respective ones of the contact tangs connect the first contacts of the electronic component along substantially lineal circuit paths extending through the loose coils of respective ones of the coil spring contacts and to the second contacts.

23. A method for receiving electronic components in a test socket and electrically connecting first contacts of the components to respective ones of second contacts of test circuitry, the method comprising the steps of:

providing a housing having a plurality of apertures, the apertures registering with the first contacts and extending between respective ones of the first and second contacts;

providing a plurality of coil spring contacts having contact ends and loosely spaced coils extending between the contact ends, the loosely spaced coils being compliant for conforming to movement of respective ones of the first contacts relative to the second contacts;

disposing the coil spring contacts in respective ones of the apertures of the housing, such that the loosely spaced coils extend between the contact ends;

disposing a plurality of contact tangs to extend interiorly within respective ones of the coil spring contacts, through at least part of respective ones of the loosely spaced coils, such that the contact tangs define substantially lineal circuit paths which extend interiorly through the loosely spaced coils to electrically connect the first contact to the second contact;

placing the electronic component in the test socket with the first contacts of the component registering with respective ones of the apertures of the housing and electrically connecting to respective ones of the coil spring contacts, such that respective ones of the contact tangs connect the first contacts of the electronic component along substantially lineal circuit paths extending through the loose coils of respective ones of the coil spring contacts and to the second contacts; and providing the contact ends of the coil spring contact with close wound coils, such that adjacent coils directly contact to provide a substantially straight circuit path through the close wound coils, and wherein the contact tangs directly contact respective ones of the close wound coils to define the lineal circuit paths between the first and second contacts.

24. The method according to claim 22, further comprising the step of forming the contact tangs from first end portions of respective ones of the coil spring contacts, wherein the first end portions are formed to extend interiorly within the loosely spaced coils of respective ones of the coil spring contacts.

25. An apparatus for electrically connecting a first contact to a second contact, the apparatus comprising:

a housing having an aperture, said aperture extending between the first and second contacts;

a coil spring contact disposed in said aperture, said coil spring contact having a first end portion, a second end portion and an intermediate portion, wherein at least said intermediate portion is defined by loosely spaced coils which extend between the first and second contacts, said loosely spaced coils having an active portion which is compliant for conforming to movement of the first contact relative to the second contact; and a contact tang extending interiorly within said coil spring contact and through at least part of said loosely spaced coils from said first end portion to said second end portion, wherein said contact tang has at least one moveable end which is slidably moveable relative a terminal end of said coil spring contact such that said contact tang extends across said active portion of said loosely spaced coils which extend between the first and second contacts to define a substantially lineal circuit path which extends interiorly through said active portion of said loosely spaced coils to electrically connect between the first and second contacts.

26. The apparatus according to claim 25, wherein said coil spring contact is defined by a single, helically wound, conductive wire having a tang portion and coils spring portion adjacent said tang portion, said coil spring portion being wound to define said loosely spaced coils, and said tang portion being formed to define said contact tang which extends interiorly within said active portion of loosely speed coils.

27. The apparatus according to claim 26, wherein said second end portions of said coil spring contact comprises a close wound coil, such that adjacent coils directly contact to provide a substantially straight circuit path through said close wound coil, and said contact tang directly contacts said close wound coils to define said lineal circuit path between said first and second contacts.

28. The apparatus according to claim 25, wherein said first contact is a through-hole lead which extends into said aperture of said housing, directly engaging against said contact tang.

29. The apparatus according to claim 25, wherein said contact tang is a separate member from said coils spring, and said contact tang extends interiorly within loosely wound coils of said coil spring contact.

30. The apparatus according to claim 28, wherein said contact tang has a head and shank, said head contacting the first contact and said shank extending within said loosely spaced coils for contacting a contact end of said coil spring.

31. The apparatus according to claim 25, further comprising a contact button disposed within said apertures, adjacent to said first end of said coil spring contact and extending from said apertures to directly engage against said first contact.

* * * * *